US008584065B2

(12) United States Patent
Iyer et al.

(10) Patent No.: US 8,584,065 B2
(45) Date of Patent: Nov. 12, 2013

(54) METHOD AND APPARATUS FOR DESIGNING AN INTEGRATED CIRCUIT

(75) Inventors: Arun Iyer, Bangalore (IN); Yousuff Mohammed Shariff, Hyderabad (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 115 days.

(21) Appl. No.: 13/116,557

(22) Filed: May 26, 2011

(65) Prior Publication Data
US 2012/0284680 A1 Nov. 8, 2012

(51) Int. Cl.
G06F 17/50 (2006.01)
(52) U.S. Cl.
USPC .......................................................... 716/108
(58) Field of Classification Search
USPC .......................................................... 716/108
See application file for complete search history.

(56) References Cited

U.S. PATENT DOCUMENTS

| 7,089,143 B2 * | 8/2006 | Foreman et al. ............... 702/125 |
| 2005/0081171 A1 * | 4/2005 | Kawano et al. ................... 716/6 |
| 2008/0104562 A1 * | 5/2008 | Ichinose ........................... 716/6 |
| 2008/0222586 A1 * | 9/2008 | Homma et al. ................... 716/6 |
| 2009/0288052 A1 * | 11/2009 | Sunohara .......................... 716/6 |

* cited by examiner

*Primary Examiner* — Jack Chiang
*Assistant Examiner* — Brandon Bowers
(74) *Attorney, Agent, or Firm* — Faegre Baker Daniels LLP (57) ABSTRACT

A method and apparatus for designing an integrated circuit to operate at a desired clock frequency range reduces process variation by estimating the value of removable pessimism from a static timing analysis. The pessimism includes, for example, at least one of the removable on-chip-variation (OCV) margin from clock paths, removable OCV margin from data paths, removable IR drop margin from clock paths, and removable interconnects margin. At the timing analysis stage of a design flow, the method and apparatus determines the value of pessimism in the timing critical paths based on timing correlation between adjacent timing critical paths. In response to the determination, the value of pessimism may be reduced in the static timing analysis of the adjacent timing critical paths to optimize the timing performance of the integrated circuit at its desired clock frequency range.

20 Claims, 10 Drawing Sheets

METHOD AND APPARATUS FOR DESIGNING AN INTEGRATED CIRCUIT

CROSS-REFERENCE TO RELATED APPLICATION

The present patent application claims priority from and the benefit of Indian Patent Application No. 1314/DEL/2011, filed May 5, 2011, and entitled METHOD AND APPARATUS FOR DESIGNING AN INTEGRATED CIRCUIT, which is hereby incorporated herein by reference.

BACKGROUND OF THE DISCLOSURE

The disclosure relates generally to a method and apparatus for designing an integrated circuit, and more particularly, to a method and apparatus for designing an integrated circuit to operate at a desired clock frequency range.

Timing analysis and optimization is a design process by which an integrated circuit design is characterized and modified to meet its timing requirement in order to assure the fabricated integrated circuit will operate at the desired clock frequency range. However, the scaling down of fabrication process technologies has increased the process variation that impacts the frequency performance of integrated circuits by reducing the timing yield, which implies the number of integrated circuits that achieve the target frequency out of the total number of integrated circuits produced.

For example, in high-performance microprocessor designs, excessive design margins caused by the increased process variation make it difficult to achieve the target frequency performance consistently all parts. In order to solve the problem, after a batch of microprocessor chips has been fabricated, the frequency selection process is needed to sort the chips into several ranks according to the measured maximum frequencies. In application specific integrated circuit (ASIC) designs, sufficient margins for process variation are required to achieve the target frequency at the expected yield. Compared with high-performance microprocessor designs, ASIC designs tend to overestimate the process variation at the circuit design phase by enlarging the design margins in its timing analysis stage to absorb all possible process variations in order to assure that the fabricated integrated circuit will operate at its desired clock frequency range. In other words, timing analysis in ASIC designs is conservative and considers the design margins pessimistically. For example, known timing related methods in ASIC designs include closing performance at the worst performance corner; using the worst possible uncertainties to account for on-chip-variation (OCV); and applying the worst case IR drop and worst case interconnects conditions. The overestimation by piling up so much pessimism at the same time, however, has an adverse effect on area and power in ASIC designs. The overestimation may cause timing goals to be missed or become excessively tight during timing analysis so that the designers have to tune a design iteratively to achieve the target frequency performance, which increases the design turnaround time. Additionally, the overestimation introduces excessive power consumption due to the pessimistic guard-bands. That is, the known conservative methods are too pessimistic to result in competitive products.

Statistical static timing analysis (SSTA), which analyzes circuit delays statistically by replacing deterministic delay with statistical distribution, is a known method for solving the above issues. The main concept of SSTA is to statistically consider the random variation of OCV in timing analysis by replacing the normal deterministic timing of gates and interconnects with probability distributions, thereby finding the most possible performance critical corner for timing analysis. However, SSTA is a very complex and time consuming analytical method, especially with realistic (non-Gaussian) distributions. Further, SSTA considers each timing critical path independently and neglects the timing correlation between adjacent timing critical paths in adjacent clock cycles. Moreover, it is difficult to couple SSTA to a timing optimization or algorithm in a standard ASIC design flow because it does not provide the data the algorithm needs. In other words, SSTA outputs a distribution of possible circuit outcomes, which is difficult for use in timing optimization.

Accordingly, there exists a need for other method and apparatus for designing an integrated circuit to operate at a desired clock frequency range in order to address one or more of the above-noted drawbacks.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF THE PREFERRED EMBODIMENTS

Briefly, in one example, a method and apparatus for designing an integrated circuit to operate at a desired clock frequency range reduces process variation by estimating the value of removable pessimism from a static timing analysis. The pessimism includes, for example, at least one of the removable on-chip-variation (OCV) margin from clock paths, removable OCV margin from data paths, removable IR drop margin from clock paths, and removable interconnects margin. At the timing analysis stage of a design flow, the method and apparatus determines the value of pessimism in the timing critical paths based on timing correlation between adjacent timing critical paths. In response to the determination, the value of pessimism may be reduced in the static timing analysis of the adjacent timing critical paths to optimize the timing performance of the integrated circuit at its desired clock frequency range.

Among other advantages, for example, the method and apparatus provides the ability to absorb the process variation margins introduced in the integrated circuit design by estimating the pessimism and giving the benefit to the timing critical paths without significant power cost. The method and apparatus takes into account the timing correlation between adjacent timing critical paths in adjacent clock cycles, thereby improving the accuracy of the estimated pessimism. Moreover, without introducing statistical distribution of the delays, the method and apparatus can be easily coupled to the standard design flow and provide information for timing optimization. Accordingly, the proposed techniques can improve the quality of integrated circuit design and ease timing closure, especially in the case of tight timing constraints, by providing a way to invariably extract pessimism from timing optimization. Other advantages will be recognized by those of ordinary skill in the art.

The method and apparatus may first determine variation information based on systematic variation information and random variation information. The systematic variation information may include IR drop and hysteresis; and the random variation information may include device variation and interconnect variation. The method and apparatus may perform a first static timing analysis at a critical corner with the determined variation information to provide a variation incorporated data delay and a variation incorporated clock delay for each of at least two adjacent timing critical paths. The method and apparatus then may perform a second static timing analysis at the same critical corner without the determined variation information to provide a non-variation incorporated data delay and a non-variation incorporated clock delay for each of the at least two adjacent timing critical paths. The method and apparatus may further determine a value of clock pessimism based on the variation incorporated clock delay and the non-variation incorporated clock delay, and determine a value of data pessimism based on the variation incorporated data delay and the non-variation incorporated data delay.

To determine the value of clock pessimism, the method and apparatus may, in the first static timing analysis, determine a first variation incorporated clock delay for the first timing critical path of the at least two adjacent timing critical paths from a common flip-flop between the at least two adjacent timing critical paths to a clock divergence point of the first timing critical path. The method and apparatus may determine a second variation incorporated clock delay for the second timing critical path of the at least two adjacent timing critical paths from the common flip-flop to a clock divergence point of the second timing critical path. The method and apparatus may, in the second static timing analysis, determine the non-variation incorporated clock delay from the common flip-flop to a common clock divergence point of the first and second timing critical paths. The method and apparatus may further determine the value of clock pessimism based on a difference between the non-variation incorporated clock delay and a larger one of the first and second variation incorporated clock delays.

To determine the value of data pessimism, the method and apparatus may determine a first incremental data delay for the first timing critical path based on a difference between a first variation incorporated data delay and a first non-variation incorporated data delay for the first timing critical path, and determine a second incremental data delay for the second timing critical path based on a difference between a second variation incorporated data delay and a second non-variation incorporated data delay for the second timing critical path. The method and apparatus may then determine a Gaussian summation and a linear summation of the first and second incremental data delays. The method and apparatus may further determine the value of data pessimism based on a difference between the Gaussian summation and the linear summation of the first and second incremental data delays.

To reduce the value of pessimism, in one embodiment, the method and apparatus generates an extended library for a plurality of flip-flops in an existing library by characterizing a slope of Clock-to-Q for varying a value of Data-to-Clock delay for each flip-flop. For each flip-flop in the extended library, the method and apparatus determines a maximum Data-to-Clock delay decrement that guarantees an equal increment of Clock-to-Q. The maximum value of Data-to-Clock delay decrement represents the maximum value of pessimism that the specific flip-flop can absorb without violating the timing requirement. The method and apparatus then determines a flip-flop with the maximum value of Data-to-Clock delay decrement that is greater than or equal to the determined value of pessimism from the plurality of flip-flops, and applies the determined flip-flop as the common flip-flop between the at least two adjacent timing critical paths that were analyzed to determine the value of pessimism in the static timing analysis. In another embodiment, the method and apparatus replaces the common flip-flop with a set of low latch and high latch and a clock delay circuit in a clock path to the low latch in the static timing analysis. The delay value of the clock delay circuit may be greater than or equal to the determined value of pessimism. In a preferred example, the delay value of the clock delay circuit is equal to the determined value of pessimism. In case that the delay value is less than the determined value of pessimism, the value of pessimism that can be reduced will be only equal to the delay value of the clock delay circuit, as opposed to the determined value of pessimism.

Optionally, the method and apparatus may output executable instructions, for example, a netlist of the designed integrated circuit, for creating the integrated circuit to operate at the desired clock frequency range based on a result of the static timing analysis taking into account the determined value of pessimism.

Among other advantages, for example, the method and apparatus provides the ability to absorb the process variation margins introduced in the integrated circuit design by estimating the pessimism and giving the benefit to the timing critical paths without significant power cost. The method and apparatus takes into account the timing correlation between adjacent timing critical paths in adjacent clock cycles, thereby improving the accuracy of the estimated pessimism. Moreover, without introducing statistical distributions, the method and apparatus can be easily coupled to the standard design flow and provide information for timing optimization. Accordingly, the proposed techniques can improve the quality of integrated circuit design and ease timing closure, especially in the case of tight timing constraints, by providing a way to invariably extract pessimism from the timing optimizations. Other advantages will be recognized by those of ordinary skill in the art.

Figure 1:
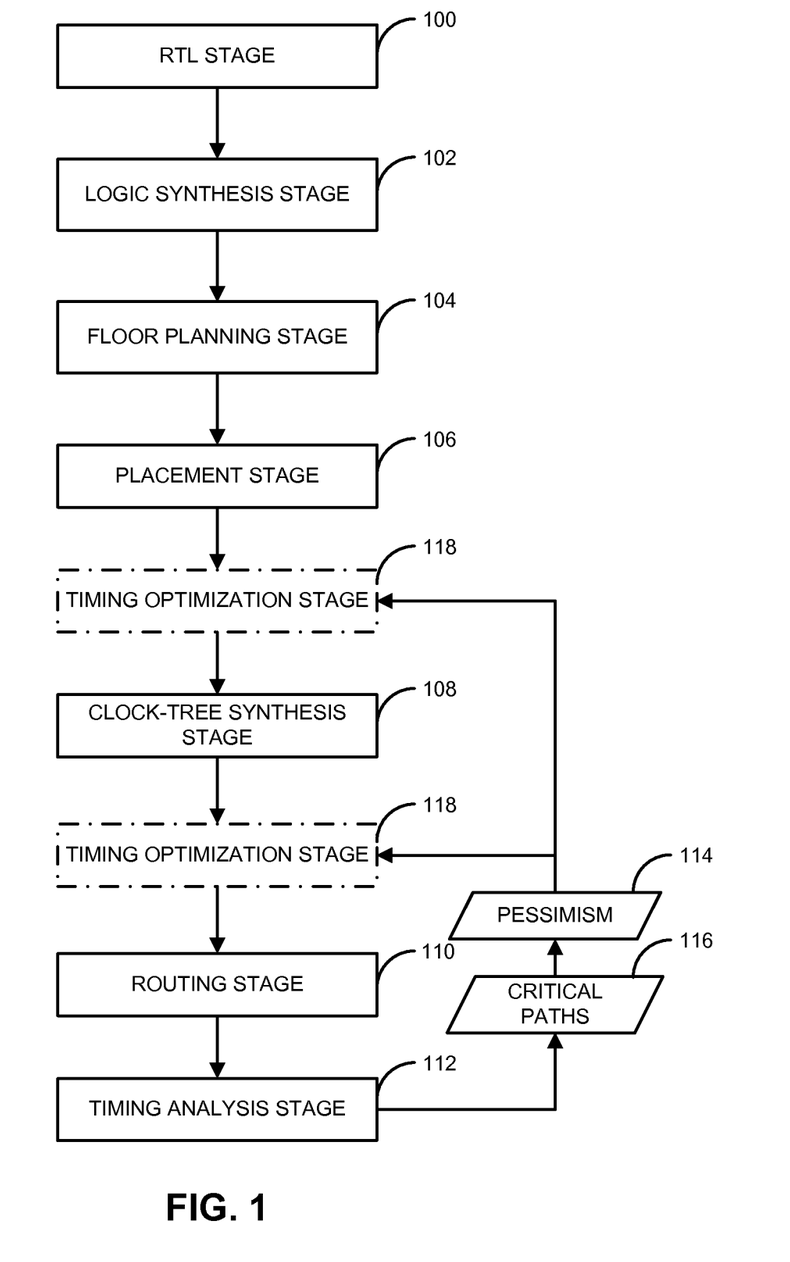
FIG. 1 is a flowchart illustrating a design flow for an integrated circuit to operate at a desired clock frequency range.

FIG. 1 illustrates one example of a design flow for an integrated circuit to operate at a desired clock frequency range. The design flow may start from the register transfer level (RTL) stage 100 in which the integrated circuit's behavior is defined in terms of the flow of signals (or transfer of data) between hardware registers, and the logical operations performed on those signals. At the RTL stage 100, hardware description languages (HDLs) like Verilog and VHDL may be used to create high-level representations of an integrated circuit, from which lower-level representations and ultimately actual interconnects can be derived. The desired circuit behavior, e.g., RTL, is then turned into a design implementation in terms of logic gates by the logic synthesis stage 102. The logic synthesis stage 102 may be performed by electronic design automation (EDA) software such as but not limited to DESIGN COMPILER. Common examples of this process include synthesis of HDLs, including VHDL and Verilog. Proceeding to the floor planning stage 104, a schematic representation of tentative placement of its major functional blocks (floor plan) is created. Placement stage 106 may be the next stage of the design flow. In this stage, a valid placement layout is produced from the synthesized circuit netlist generated from the previous stages together with a technology library. The location of each active element of the integrated circuit is determined at this stage. The placement stage 106 may be performed by EDA software such as but not limited to ENCOUNTER or IC COMPILER. The clock-distribution network is then designed at the clock-tree synthesis stage 108 by developing interconnects that connect the system clock into all the cells in the integrated circuit that uses the clock. The primary goal of the clock-tree synthesis stage 108 is to vary routing paths, placement of the clocked cells, and clock buffers to meet maximum clock skew specifications. Moving to the routing stage 110, all interconnects need to properly connect the placed component according to all design rules of the integrated circuit. That is, interconnects for both the clock paths and data paths are determined after the clock-tree synthesis stage 108 and the routing stage 110.

In order to assure that the designed integrated circuit meets the specific speed requirement, timing performance of the designed integrated circuit is validated at the timing analysis stage 112 by checking all possible paths for timing violations (i.e., timing constraints) under worst case conditions. If the timing analysis stage 112 determines that the integrated circuit cannot operate at the desired clock frequency range, a timing closure process is necessary to modify the design through one or more timing optimization stages 118. In this example, the method and apparatus may provide information including the value of pessimism 114 in timing critical paths 116 to the timing optimization stage 118. The pessimism referred herein is, for example, the delay margin that is introduced in response to variations in timing analysis of an integrated circuit design and can be reduced (absorbed) without violating the timing requirement of the design. The pessimism may include, for example, the removable OCV margin from clock paths due to local variations, removable OCV margin from data paths due to local variations, removable IR drop margin from clock paths, and removable interconnects margin. The value of pessimism may be in time units such as picosecond (ps) or nanosecond (ns). For example, the range of the values of pessimism may be from about 3% to about 5% of the corresponding clock period. In one example, for a desired clock frequency of 1 GHz, the range of the values of pessimism may be from about 30 ps to about 50 ps. It is understood that the examples above are provided for illustration purpose only and is not meant to limit the possible value of pessimism. The timing optimization stage 118 then applies the information provided from the timing analysis stage 112 to improve the timing performance at the clock-tree synthesis stage 108, routing stage 110, and/or any other suitable stage in the design flow.

Figure 2:
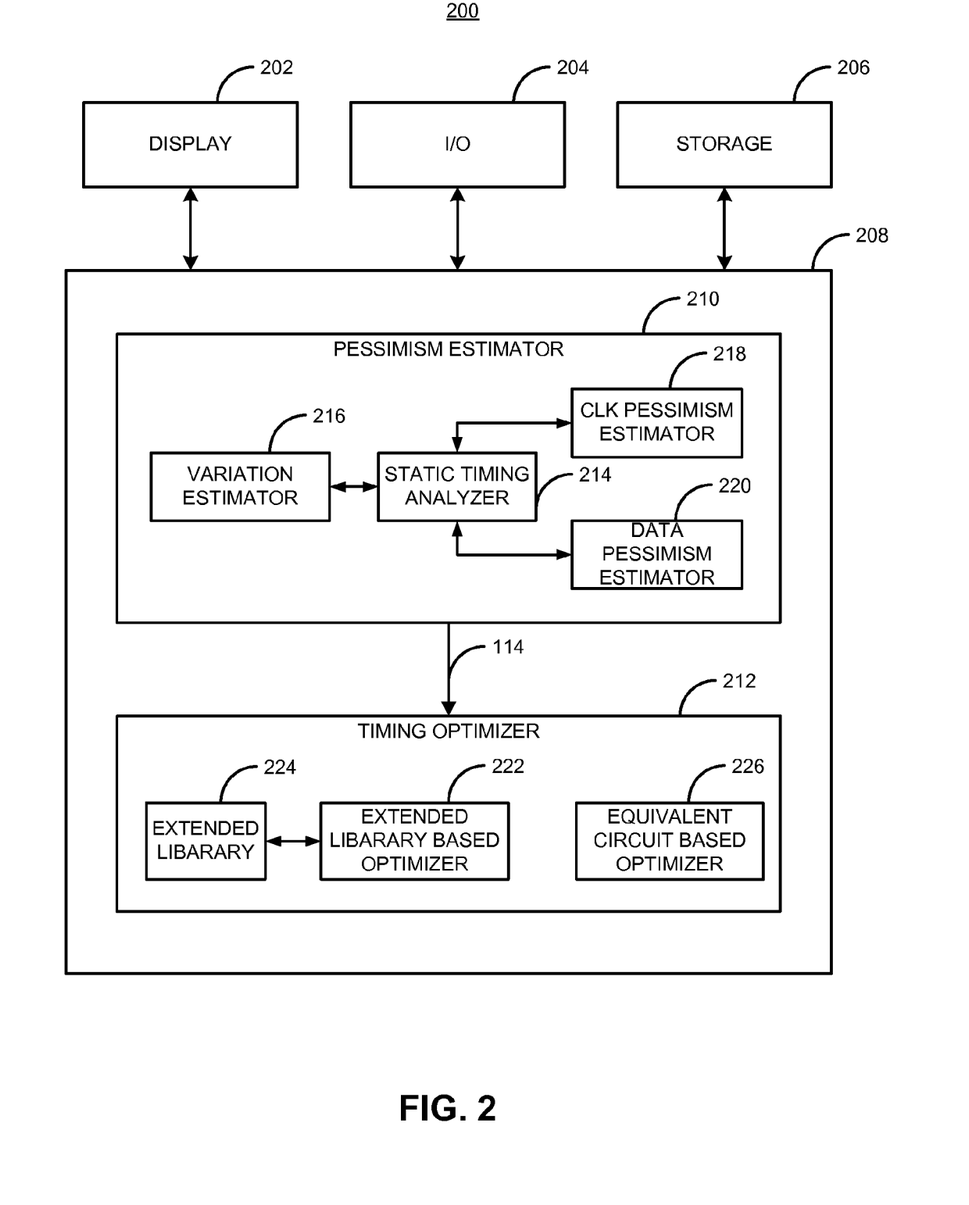
FIG. 2 is a block diagram illustrating an apparatus for designing an integrated circuit to operate at a desired clock frequency range in accordance with one embodiment set forth in the disclosure.

FIG. 2 illustrates one example of an apparatus 200 for designing an integrated circuit to operate at a desired clock frequency range. The apparatus 200 may be any suitable device, for example, a workstation, personal computer, server computer, handheld device, or any other suitable device. In one example, the apparatus 200 may be one or more AMD OPETERON quad-core servers running operating systems such as LINUX or SOLARIS. In this example, the apparatus 200 employs one or more displays 202, an input/output (I/O) system 204, and one or more storage devices 206, such as but not limited to system memory or hard drive. The apparatus 200 also includes at least one processor 208 operatively coupled to the displays 202, I/O system 204, and storage devices 206 through data buses or point-to-point connections. Any other suitable components, such as but not limited to controllers or network interfaces, may also be included in the apparatus 200.

In this example, the processor 208 may be a central processing unit (CPU) having one or multiple cores, which is bi-directionally connected to the storage devices 206 and other components of the apparatus 200 via data buses. In other examples, the processor 208 may be a general processor (e.g., APU, accelerated processing unit; GPGPU, general-purpose computing on GPU) or any other suitable processor. Although one processor 208 is shown in FIG. 2, it is understood that multiple processors may be employed in other examples. In this example, a pessimism estimator 210 and a timing optimizer 212 may be implemented by the processor 208. For example, the pessimism estimator 210 and timing optimizer 212 may be stored in the storage devices 206 in the form of executable instructions. Once the instructions are executed by the processor 208, the processor 208 performs operations described hereafter.

In this example, the pessimism estimator 210 is operative to determine the value of pessimism 114 in the static timing analysis. The pessimism estimator 210 may include a static timing analyzer 214 operative to perform the static timing analysis of the integrated circuit design. The pessimism estimator 210 may also include a variation estimator 216 operatively coupled to the static timing analyzer 214. The variation estimator 216 is operative to determine the variation information for the static timing analyzer 214. The variation information may include systematic variation information, such as IR drop and hysteresis, and random variation information, such as device and interconnect mismatch caused by process-voltage-temperature (PVT) variation. The pessimism estimator 210 may further include a clock pessimism estimator 218 and a data pessimism estimator 220 operatively coupled to the static timing analyzer 214. The clock pessimism estimator 218 and data pessimism estimator 220 are operative to determine the value of clock pessimism in clock paths and the value of data pessimism in data paths, respectively, based on the results of the static timing analysis performed by the static timing analyzer 214. The values of the clock and data pessimism are then used to determine the value of pessimism 114, which is the output of the pessimism estimator 210. As discussed above, the pessimism estimator 210 may be applied at the timing analysis stage 112 of the design flow.

In this example, the timing optimizer 212 is operatively coupled to the pessimism estimator 210 and is operative to reduce the value of pessimism 114 in the static timing analysis. In one embodiment, the timing optimizer 212 may include an extended library based optimizer 222 in conjunction with an extended library 224. The extended library 224 may be created for flip-flops in an existing library for circuit design by characterizing a slope of Clock-to-Q for varying a value of Data-to-Clock delay for each flip-flop. The extended library based optimizer 222 may be operative to, for each flip-flop in the extended library 224, determine a maximum Data-to-Clock delay decrement that guarantees an equal increment of Clock-to-Q. The extended library based optimizer 222 may be further operative to determine a flip-flop with the maximum Data-to-Clock delay decrement that is greater than or equal to the determined value of pessimism 114 from the plurality of flip-flops, and apply the determined flip-flop as the common flip-flop between adjacent timing critical paths in the static timing analysis to reduce the pessimism. In another embodiment, the timing optimizer 212 may include an equivalent circuit based optimizer 226 operative to replace the common flip-flop with a set of low latch and high latch and a clock delay circuit in the static timing analysis to reduce the pessimism. The delay value of the clock delay circuit is greater than or equal to the determined value of pessimism 114. In a preferred example, the delay value of the clock delay circuit is equal to the determined value of pessimism 114. In case that the delay value is less than the determined value of pessimism 114, the pessimism that can be reduced will be only equal to the delay value of the clock delay circuit, as opposed to the determined value 114. As discussed above, the timing optimizer 212 may be applied at the timing optimization stage 118 of the design flow.

Figure 3:
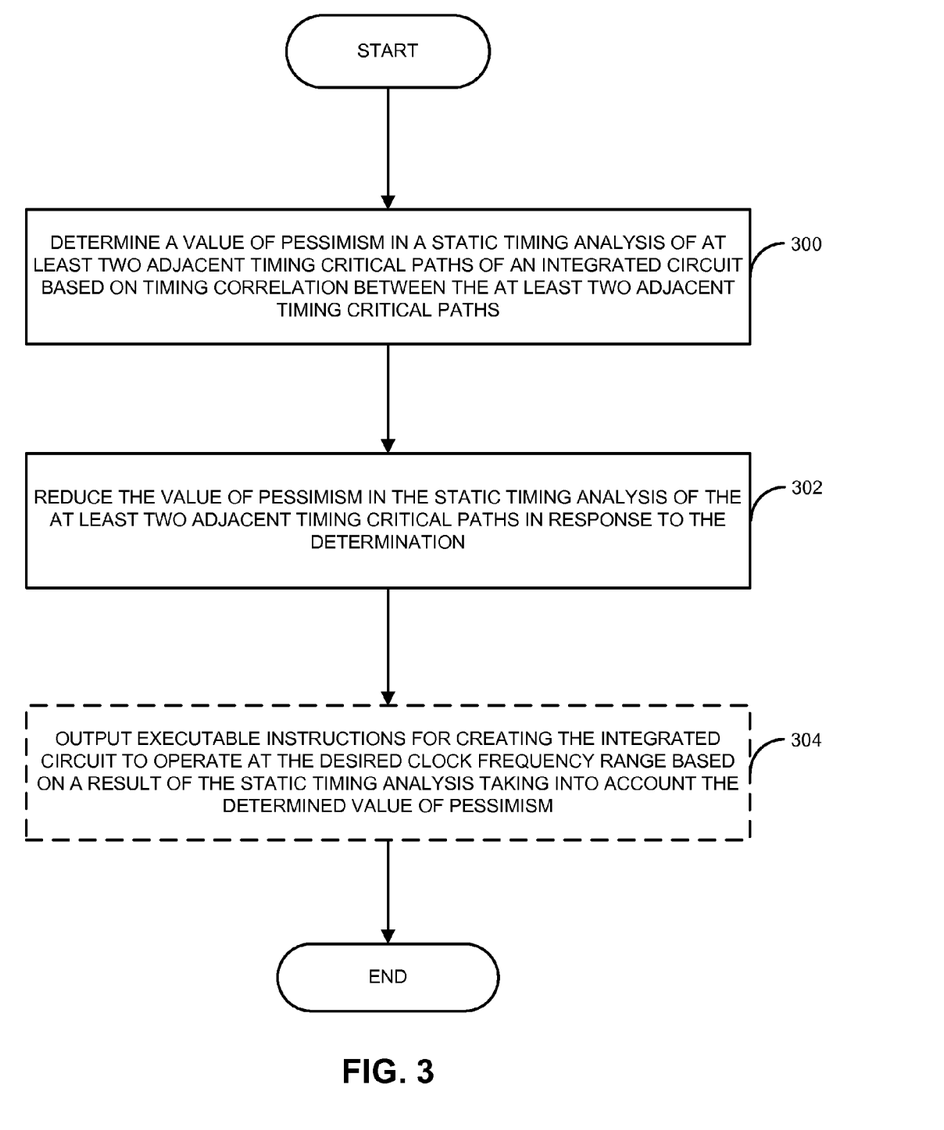
FIG. 3 is a flowchart illustrating a method for designing an integrated circuit to operate at a desired clock frequency range in accordance with one embodiment set forth in the disclosure.

FIG. 3 illustrates one example of a method for designing an integrated circuit to operate at a desired clock frequency range. It will be described with reference to FIG. 2. However, any suitable logic or structure may be employed. In operation, at block 300, a value of pessimism in a static timing analysis of at least two adjacent timing critical paths of an integrated circuit is determined based on timing correlation between the at least two adjacent timing critical paths. As described above, this may be performed by the pessimism estimator 210 implemented by the processor 208.

Figure 4:
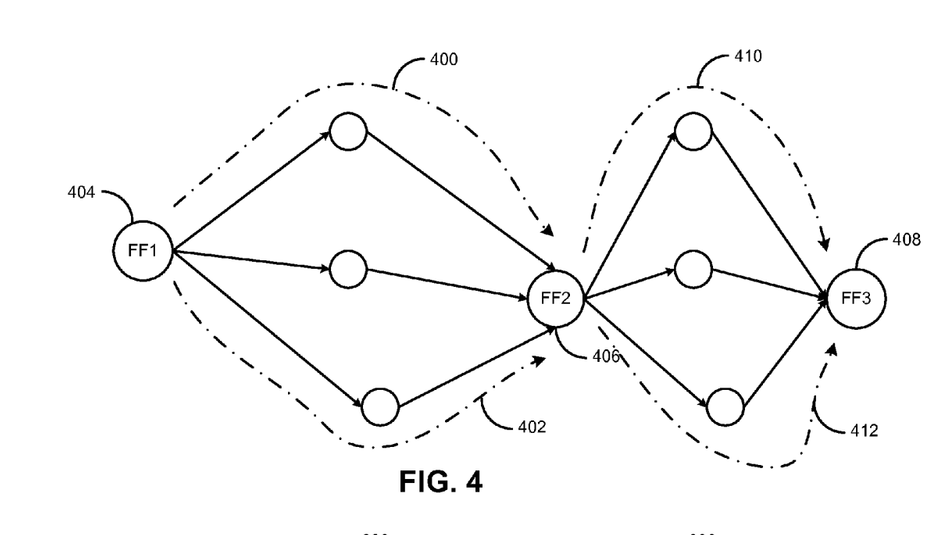
FIG. 4 is an exemplary illustration of a plurality of adjacent timing critical paths of an integrated circuit in a static timing analysis.

Static timing analysis is a method of validating the timing performance of a design by checking all possible timing paths for timing violations under worst case conditions. Static timing analysis may be performed by various EDA software, such as but not limited to DESIGN COMPILER, ENCOUNTER, IC COMPILER, or PRIME TIME, at different design stages as described above. Referring to FIG. 4, each timing path starts from one flip-flop and ends at another flip-flop of the integrated circuit. For example, by traversing all nodes from flip-flop 1 (FF1) 404 to flip-flop 2 (FF2) 406, multiple timing paths may be identified. Each node may be any suitable combinational logic of the integrated circuit such as AND, OR, NOR, etc. The slack associated with each timing path is the difference between the required time and the arrival time and can be determined by the static timing analysis as known in the art. All timing paths that have the value of slack less than a predetermined value may be considered as timing critical paths in the static timing analysis. For example, if the predetermined value is 0 ps, then all timing paths that have negative slacks are considered to be timing critical paths. A positive slack value at a flip-flop implies that the arrival time at that flip-flop may be increased by its value without affecting the overall performance of the circuit. Conversely, negative slack implies that a timing path is too slow, and the timing path must be sped up (or the reference signal delayed) if the whole circuit is to work at the desired speed. Accordingly, timing critical paths in this example are those timing paths that do not meet the timing requirement.

In FIG. 4, the timing path 400 may be a timing critical path between the two flip-flops 404, 406 in the static timing analysis if the slack of this timing path 400 is negative. It is also understood that more than one timing critical paths may exist between FF1 404 and FF2 406. For example, another timing path 402 may also be a timing critical path if its associated slack is negative. Likewise, multiple timing paths may be identified between FF2 406 and flip-flop 3 (FF3) 408. The timing paths between FF1 404 and FF2 406 and the timing paths between FF2 406 and FF3 408 are considered as adjacent timing paths. The timing paths between FF2 406 and FF3 408 may also include one or more timing critical paths 410, 412 as described above. In one example, the timing critical path 410 is identified based on its adjacent timing critical path 400, and the timing critical path 412 is identified based on its adjacent timing critical path 402. When identifying the timing critical paths, if the common flip-flop between adjacent timing critical paths (e.g., FF2 406) has feedback paths, e.g. feeding from its output back to its input, such common flip-flop may not be used. In case that two adjacent timing critical paths are identified where their common flip-flop has a feedback, the combination of these two adjacent timing critical paths may be removed from the list of all adjacent timing critical paths where the value of pessimism is to be determined.

Referring back to FIG. 3, at block 302, in response to the determination at block 300, the value of pessimism in the static timing analysis of the at least two adjacent timing critical paths is reduced. As described above, this may be performed by the timing optimizer 212 implemented by the processor 208. Block 302 is described in greater detail below with reference to FIGS. 10 and 13. Optionally, at block 304, executable instructions for creating the integrated circuit to operate at the desired clock frequency range may be generated and outputted based on a result of the static timing analysis taking into account the determined value of pessimism. For example, the executable instructions may be a netlist of the designed integrated circuit, which is outputted through the I/O system 204 by the processor 208 of the apparatus 200.

Figure 5:
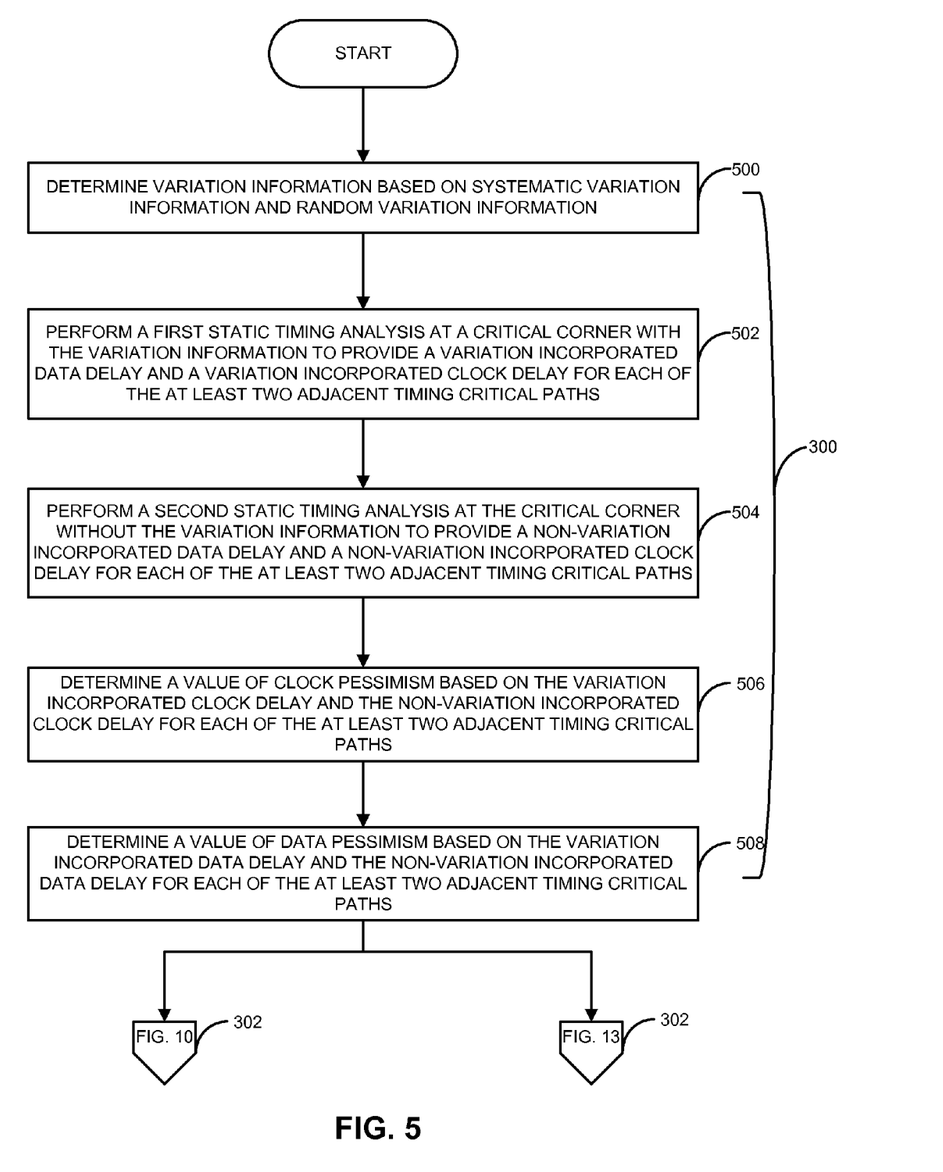
FIG. 5 is a flowchart illustrating a method for determining a value of pessimism in a static timing analysis of at least two adjacent timing critical paths of an integrated circuit in accordance with one embodiment set forth in the disclosure.

FIG. 5 illustrates one example of a method for determining a value of pessimism in a static timing analysis of at least two adjacent timing critical paths of an integrated circuit shown at block 300 of FIG. 3. It will be described with reference to FIG. 2. However, any suitable logic or structure may be employed. Starting from block 500, variation information is determined based on systematic variation information and random variation information. As described above, this may be performed by the variation estimator 216 of the pessimism estimator 210. In this example, various factors used to determine the uncertainties/derates (i.e., variation information) for performance analysis in the static timing analysis are obtained. These factors include but are not limited to process mismatch, IR drop, metal RC variation, and systematic effects like hysteresis. These factors may be categorized into systematic variations and random variations: factors like IR drop in the data path and hysteresis are systematic variations, and device and interconnects mismatches and the difference between the IR drop in the clock path of launch flip-flop and capture flip-flop are random variations. The value of the uncertainty/derates for systematic and random variations may be determined by any suitable techniques known in the art.

Proceeding to block 502, a first static timing analysis is performed at a critical corner with the determined variation information to provide a variation incorporated data delay and a variation incorporated clock delay for each of the at least two adjacent timing critical paths. As described above, this may be performed by the static timing analyzer 214 of the pessimism estimator 210. Behavior of an integrated circuit is often dependent on various factors in its environment like temperature or local voltage variations. In such a case, either the static timing analysis needs to be performed for more than one such set of conditions, or the static timing analysis must be prepared to work with a range of possible delays for each component, as opposed to a single value. If the design works at each extreme condition, then under the assumption of monotonic behavior, the design is also qualified for all intermediate points. Accordingly, the critical corner referred herein is one set of extreme conditions (worst case or best case condition) in the static timing analysis. In this example, the critical corner is a set of worst case conditions that introduces the largest delay and pessimism in the static timing analysis.

Referring now to FIG. 4, as discussed above, there may be a number of timing critical paths between FF1 404 and FF2 406. In this example, all the top N timing critical paths ranked by its associated slack are first identified between FF1 404 and FF2 406 and form a collection of timing critical paths "$all_paths". The number of N is arbitrary and may be determined by the designers based on the complexity of the design. In one example, the number of N is set to be 1000. For each timing critical path between FF1 404 and FF2 406, an adjacent timing critical path between FF2 406 and FF3 408 may be identified. For example, each timing critical path between FF1 404 and FF2 406 may be represented as $a2b, and its adjacent timing critical path between FF2 406 and FF3 408 may be represented as $b2c. In this example, FF2 406 is the common flip-flop between the adjacent timing critical paths $a2b and $b2c. As described above, when identifying the timing critical paths, if the common flip-flop between adjacent timing critical paths (e.g., FF2 406) has feedback paths, e.g. feeding from its output back to its input, such common flip-flop may not be used. In case that two adjacent timing critical paths are identified where their common flip-flop has a feedback, the combination of these two adjacent timing critical paths may be removed from the collection of all adjacent timing critical paths where the value of pessimism is to be determined.

Figure 6:
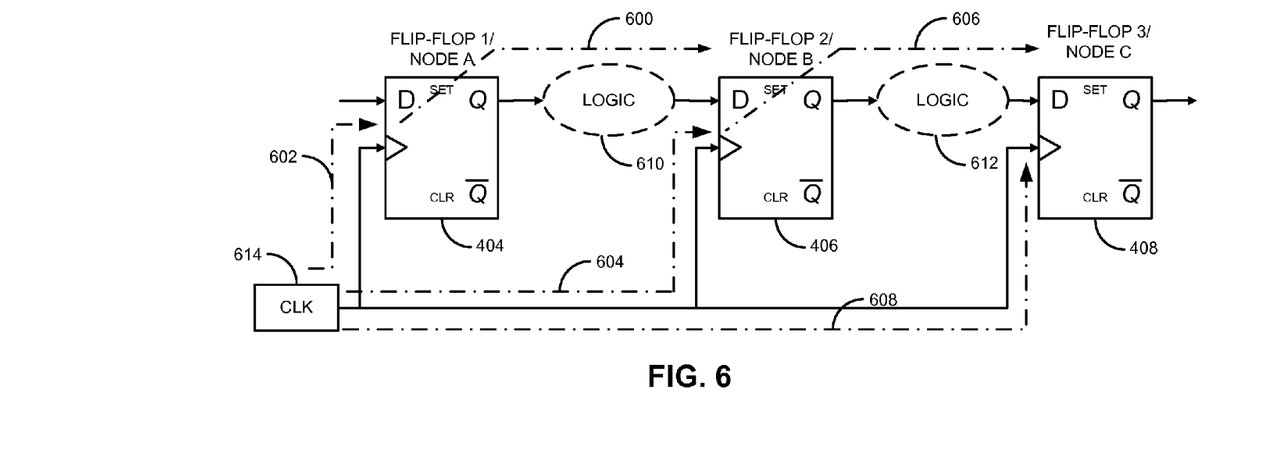
FIG. 6 is an exemplary illustration of two adjacent timing critical paths of an integrated circuit in a static timing analysis.

Referring now to FIG. 6, it is known in the art that each adjacent timing critical path may include at least a data path and a clock path in the static timing analysis. For example, the timing critical path $a2b may include its data path 600 and its clock paths 602, 604, and the adjacent timing critical path $b2c may include its data path 606 and its clock paths 604, 608. In this example, the data path 600 is from the clock pin of FF1 404 to the data input pin (D) of FF2 406. The delay of the data path 600 may include the delay from the clock pin to the data output pin (Q) of FF1 404 and the delay of the combinational logic 610 between FF1 404 and FF2 406. In this example, the static timing analysis estimates the delay in the data path 600 ($dp_ab), and because the first static timing analysis at block 502 is performed by applying the variation information on the design, the delay ($dp_ab) is considered as a variation incorporated data delay for the first timing critical path $a2b. Similarly, a variation incorporated data delay ($dp_bc) for the adjacent timing critical path (the second timing critical path) $b2c may also be estimated at block 502 from the first static timing analysis. The data delay ($dp_bc) may include the delay from the clock pin to the data output pin (Q) of FF2 406 and the delay of the combinational logic 612 between FF2 406 and FF3 408.

Figure 7:
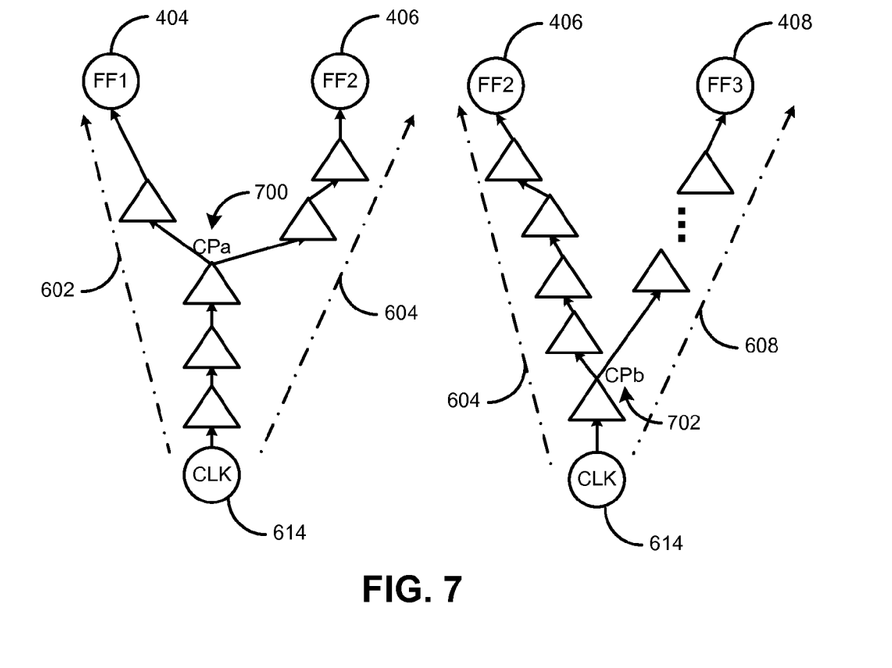
FIG. 7 is an exemplary illustration of clock delays of two adjacent timing critical paths in a static timing analysis.

As to the clock paths, the delay may be caused by the interconnects, inverter, buffers, dividers, and/or any circuit component between the clock input point 614 and the clock pin of each flip-flop. Also referring to FIG. 7, a clock divergence point for each timing critical path may be identified in the clock paths. In FIG. 7, each clock buffer represents a unit delay in the clock path. For example, clock paths 602, 604 are associated with the first timing critical path $a2b, and a clock divergence point CPa 700 of the two clock paths 602, 604 may be identified for the first timing critical path $a2b. Likewise, a clock divergence point CPb 702 of the two clock paths 604, 608 may also be identified for the second timing critical path $b2c. In one embodiment, by performing the first static timing analysis, a first variation incorporated clock delay ($Tcpa) for the first timing critical path $a2b is estimated from the clock divergence point CPa 700 to the common flip-flop (FF2 406), and a second variation incorporated clock delay ($Tcpb) for the second timing critical path $b2c is estimated from the clock divergence point CPb 702 to the common flip-flop (FF2 406).

Referring back to FIG. 5, at block 504, a second static timing analysis is performed at the same critical corner without the determined variation information to provide a non-variation incorporated data delay and a non-variation incorporated clock delay for each of the at least two adjacent timing critical paths. In other words, another static timing analysis is run at the same extreme conditions but without applying any uncertainties/derates to the design. As described above, this may also be performed by the static timing analyzer 214 of the pessimism estimator 210. Similar to block 502, a non-variation incorporated data delay for the first timing critical path $a2b and a non-variation incorporated data delay for the second timing critical path $b2c are estimated by the second static timing analysis. As to clock delay, because there is no clock uncertainty that has been applied to the design in the second static timing analysis, the clock divergence points for the two adjacent timing critical paths $a2b and $b2c may be the same in this example. In other words, the two adjacent timing critical paths $a2b and $b2c have a common clock divergence point CPx in this case. Thus, the non-variation incorporated clock delays ($Tcpx) for the two adjacent timing critical paths $a2b and $b2c are the same and are estimated from the common clock divergence point CPx to the common flip-flop (FF2 406).

Figure 8:
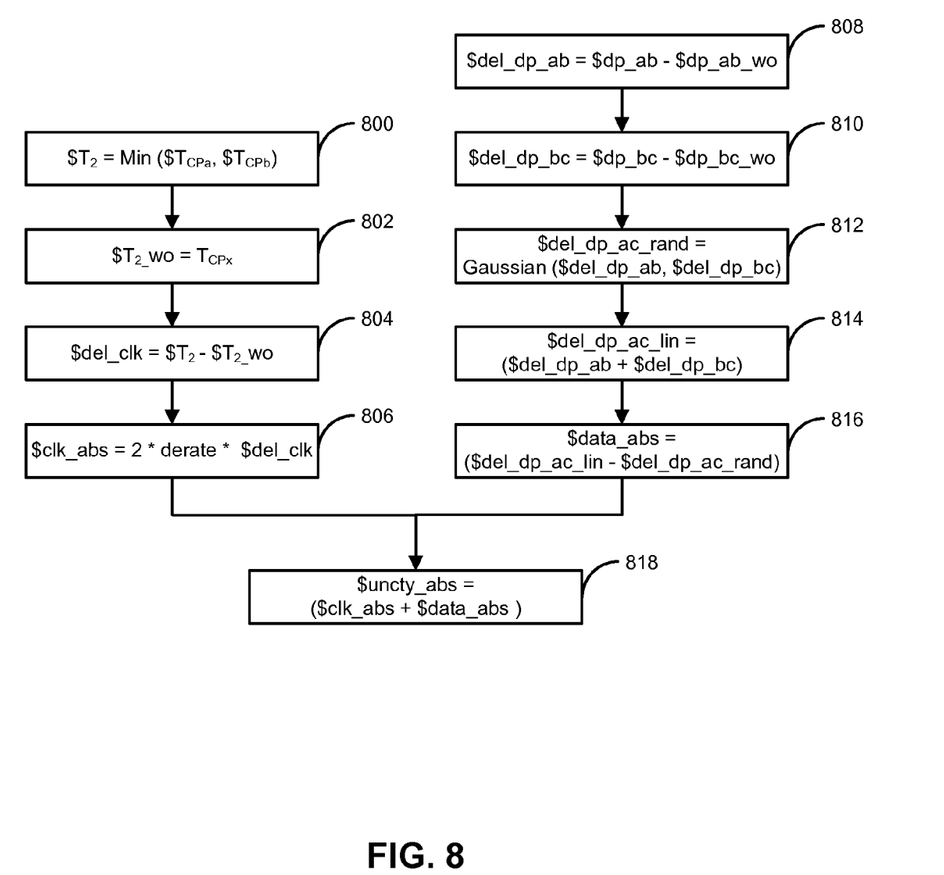
FIG. 8 is a flowchart illustrating one example of an algorithm for determining a value of pessimism in a static timing analysis of at least two adjacent timing critical paths of an integrated circuit.

At block 506, a value of clock pessimism is determined based on the variation incorporated clock delay and the non-variation incorporated clock delay for each of the at least two adjacent timing critical paths. As described above, this may be performed by the clock pessimism estimator 218 of the pessimism estimator 210. FIG. 8 illustrates one example of an algorithm for determining the value of clock pessimism ($clk_abs) and the value of data pessimism ($data_abs). The clock pessimism referred herein is, for example, the delay margin that is introduced in the clock path in response to variations in timing analysis of an integrated circuit design and can be reduced (absorbed) without violating the timing requirement of the design. Referring now to FIG. 8, at block 800, the first variation incorporated clock delay ($Tcpa) is compared with the second variation incorporated clock delay ($Tcpb), and the smaller one is set to be $T_2$. Taking FIG. 7 for example, because $Tcpa (two buffers) is smaller than Tcpb (four buffers), $T_2$ equals to $Tcpa. At block 802, as discussed above, if the non-variation incorporated clock delays for the two adjacent timing critical paths $a2*b* and $b2*c* determined at block 504 are the same ($Tcpx), this value is set to be $T_{2\_wo}$. Moving to block 804, the algorithm may calculate the difference between $T_2$ and $T_{2\_wo}$ and assign the value to be $del_clk. This value represents the amount of displacement of the clock arrival time at FF2 406 due to the clock uncertainty.

At block 806, assuming without loss of generality, that the variation factors used on launch and capture clock-edges are identical, then the actual value of clock uncertainty that is absorbable (i.e., clock pessimism due to the way clock uncertainty is applied in the static timing analysis). The clock pessimism ($clk_abs) can be calculated as: $clk_abs=2*derate*$del_clk, where "derate" is the net variation factor applied on launch and capture edges. However, if the variation factor for launch and capture edges are not the same, then "2*derate" may be replaced with the summation of derates applied on the launch and capture edges.

Figure 9:
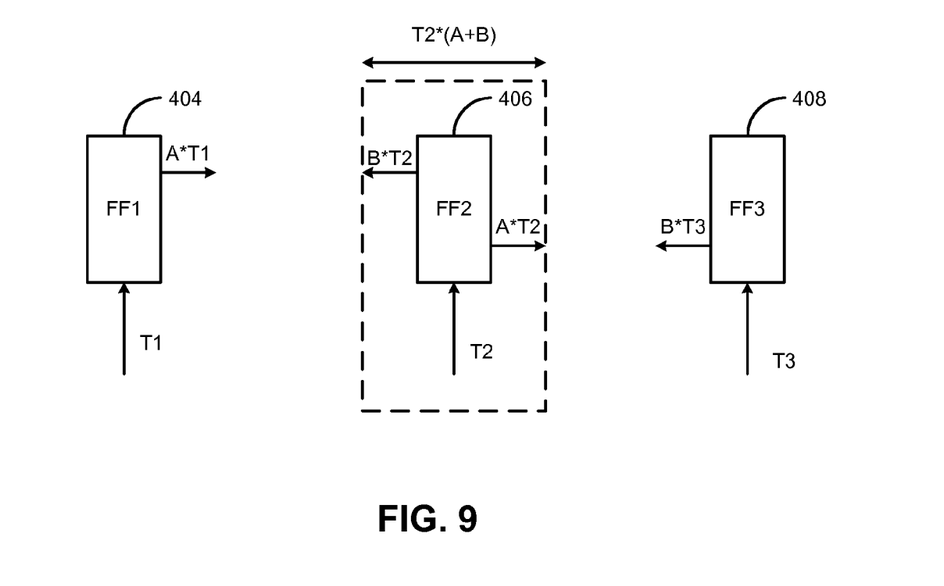
FIG. 9 is an exemplary illustration of clock pessimism of two adjacent timing critical paths in a static timing analysis.

Block 806 is illustrated in FIG. 9. In FIG. 9, "T1" represents the arrival time of clock edge for FF1 404, "T2" represents the arrival time of clock edge for FF2 406, and "T3" represents the arrival time of clock edge for FF3 408. "A" and "B" are the variation factors (i.e., derate) for the launch and capture edges for FF2 406, respectively. In one example, assuming the value of derate is determined to be 5% of an average delay, then +5% derate (B) is applied to the captured edge of FF2 406 for the first timing critical paths $a2*b*, and −5% derate (A) is applied to the launch edge of FF2 406 for the second timing critical paths $b2*c*. The maximum value of clock pessimism that can be absorbed in this case is T2*(A+ B).

Referring back to FIG. 5, at block 508, a value of data pessimism is determined based on the variation incorporated data delay and the non-variation incorporated data delay for each of the at least two adjacent timing critical paths. As described above, this may be performed by the data pessimism estimator 220 of the pessimism estimator 210. Referring now to FIG. 8, at block 808, the algorithm may calculate the difference between the variation incorporated data delay ($dp_ab) and the non-variation incorporated data delay ($dp_ab_wo) and assign the value to the first incremental data delay ($del_dp_ab) for the first timing critical path $a2*b* due to variation (uncertainty/derate) in the data path. Likewise, at block 810, the second incremental data delay ($del_dp_bc) for the second timing critical path $b2*c* is calculated as the difference between the variation incorporated data delay ($dp_bc) and the non-variation incorporated data delay ($dp_bc_wo) for the second timing critical path $b2*c*. In one example, the contribution of systematic variation (e.g., IR drop in the data path and hysteresis) may be removed from the first and second incremental data delays ($del_dp_ab, $del_dp_bc), respectively, and the value remaining in the incremental data delays ($del_dp_ab, $del_dp_bc) is due to random variation in device and interconnects.

Proceeding to block 812, in one example, because the incremental data delays ($del_dp_ab, $del_dp_bc) are random and may be assumed to be Gaussian, the actual incremental data delay from FF1 404 to FF3 408 ($a2*c*) is the Gaussian summation of the incremental data delays ($del_dp_ab, $del_dp_bc) on each of the two adjacent timing critical paths $a2*b* and $b2*c*. The function in block 812 represents the root sum square operation of the input variables. At block 814, when the two adjacent timing critical paths $a2*b* and $b2*c* are taken independently, then the actual incremental data delay from FF1 404 to FF3 408 ($a2*c*) only has a linear summation instead of Gaussian summation. At block 816, the amount of data pessimism ($data_abs) from FF1 404 to FF3 408 ($a2*c*), assuming considering the timing correlation between the two adjacent timing critical paths $a2*b* and $b2*c*, is calculated as the difference between the linear summation and the Gaussian summation of the incremental data delays ($del_dp_ab, $del_dp_bc) on each of the two adjacent timing critical paths $a2*b* and $b2*c*. At block 818, the net value of pessimism ($uncty_abs) may be the summation of the value of clock pessimism ($clk_abs) and the value of data pessimism ($data_abs).

Although the processing blocks illustrated in FIGS. 5 and 8 are illustrated in a particular order, those having ordinary skill in the art will appreciate that the processing can be performed in different orders. In one example, block 506 can be performed after block 508 or performed essentially simultaneously. The value of the clock pessimism ($clk_abs) may be determined after the data pessimism ($data_abs), or the two values may be determined simultaneously.

Figure 10:
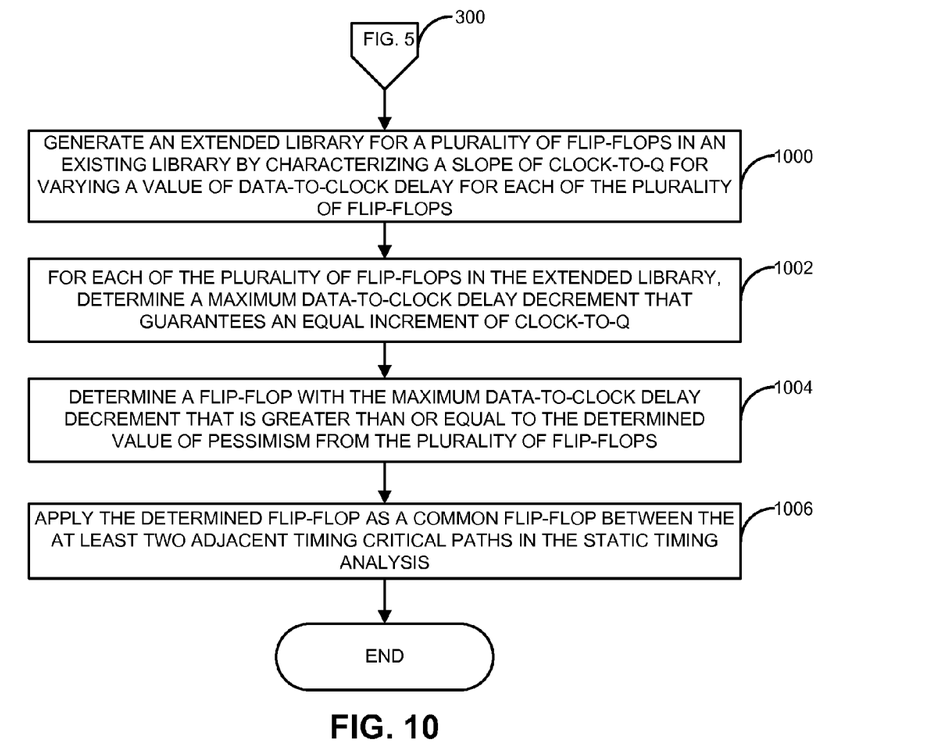
FIG. 10 is a flowchart illustrating one example a method for reducing a value of pessimism in a static timing analysis of at least two adjacent timing critical paths of an integrated circuit in accordance with one embodiment set forth in the disclosure.
Figure 11:
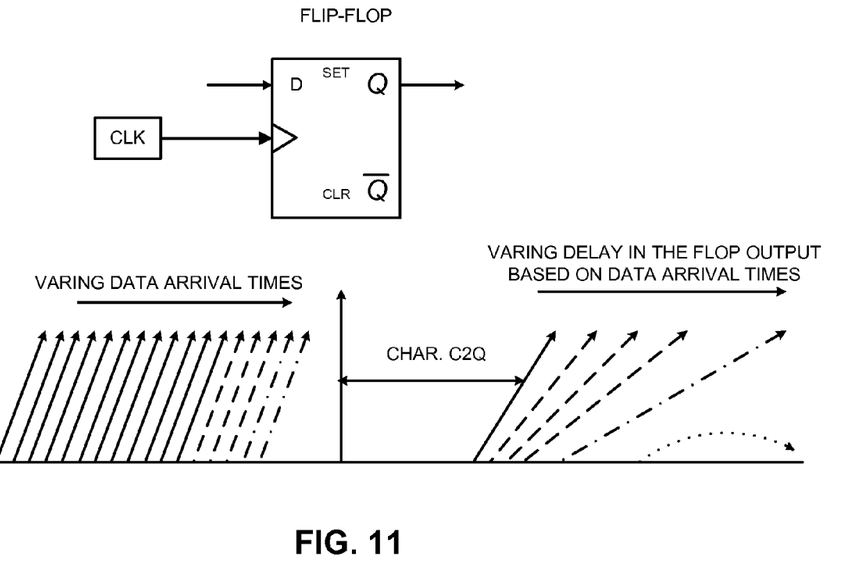
FIGS. 11 and 12 are exemplary illustrations of characterizing a slope of Clock-to-Q for varying a value of Data-to-Clock delay for a flip-flop based on a determined value of pessimism.
Figure 12:
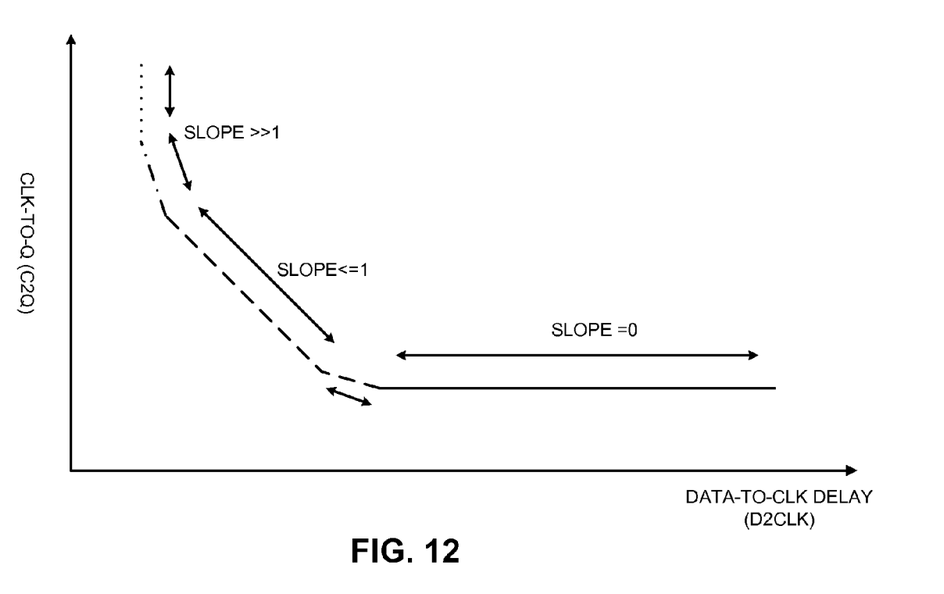

FIG. 10 illustrates one example a method for reducing a value of pessimism in a static timing analysis of at least two adjacent timing critical paths shown at block 302 of FIG. 3 in accordance with one embodiment set forth in the disclosure. In response to the determination of the value of pessimism, at block 1000, an extended library 224 for a plurality of flip-flops in an existing library may be generated by characterizing a slope of Clock-to-Q (C2Q) for varying a value of Data-to-Clock (D2CLK) delay for each flip-flop. It is known in the art to have a standard library of flip-flops for integrated circuit design. In one example, all the high-performance variety of flip-flops may be characterized to create the extended library. Block 1000 is illustrated in FIGS. 11 and 12. In this example, the arrival time of the data signals is continuously varied with respect to the clock signal (D2CLK) as shown in FIG. 11. FIG. 12 illustrates how the slope of C2Q is around zero for very large value of D2CLK, approaches to unity for some range of D2CLK (can vary for different types of flip-flops), and eventually degrades (>>1) significantly for very small values of D2CLK (indicating the point of failure of the flip-flop to capture the clock edges). In response, a lookup table with the slope of C2Q for every value of D2CLK delay may be created until the flip-flop fails to capture.

At block 1002, for each of the plurality of flip-flops in the extended library, a maximum Data-to-Clock delay decrement that guarantees an equal increment of Clock-to-Q is determined. As discussed above, this may be performed by the extended library based optimizer 222 in conjunction with the extended library 224. For example, referring to FIG. 12, this is equivalent to identifying a longest line on the C2Q curve with a slope of −1. The value of D2CLK delay decrement that covers this line of slope −1 represents the maximum value of pessimism the specific flip-flop can absorb.

At block 1004, a flip-flop with the maximum D2CLK delay decrement that is greater than or equal to the determined value of pessimism is determined from the plurality of flip-flops. As discussed above, this may also be performed by the extended library based optimizer 222 in conjunction with the extended library 224. In one example, based on the value of pessimism ($uncty_abs) determined at block 300, the extended library based optimizer 222 may search the lookup table created at block 1000 to find a flip-flop having the largest value of D2CLK delay decrement that is greater than or equal to the determined value of pessimism. At block 1006, the determined flip-flop with the largest value of D2CLK delay decrement may be applied as the common flip-flop between the at least two adjacent timing critical paths in the static timing analysis. For example, the determined flip-flop may be applied as FF2 406, which is the common flip-flop between the two adjacent timing critical paths $a2b$ and $b2c$. In other words, the value of D2CLK delay decrement from the extended library 224 that meets the requirement is credited to the timing critical path $a2b$, and the pessimism in the timing critical paths is reduced. If the largest value of D2CLK delay decrement is determined to be equal to the value of pessimism ($uncty\_abs$), then the pessimism in the timing critical paths is removed from the static timing analysis. Accordingly, after block 1004, rerunning the static timing analysis may result in improving timing characteristics/slack for the whole design. The value of the slack improvement is restricted by the slope characteristics of the common flip-flop of the adjacent timing critical paths. In one example, if the slack improvement is less than the determined value of pessimism ($uncty\_abs$), the determined flip-flop at block 1002 may be replaced with other high performance flip-flops from the extended library 224.

Figure 13:
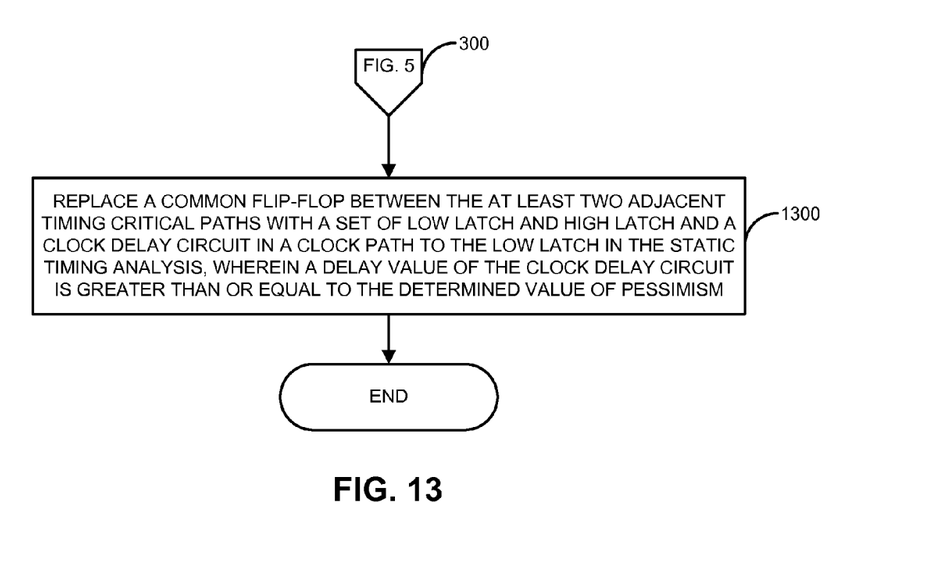
FIG. 13 is a flowchart illustrating another example a method for reducing a value of pessimism in a static timing analysis of at least two adjacent timing critical paths of an integrated circuit in accordance with another embodiment set forth in the disclosure.
Figure 14:
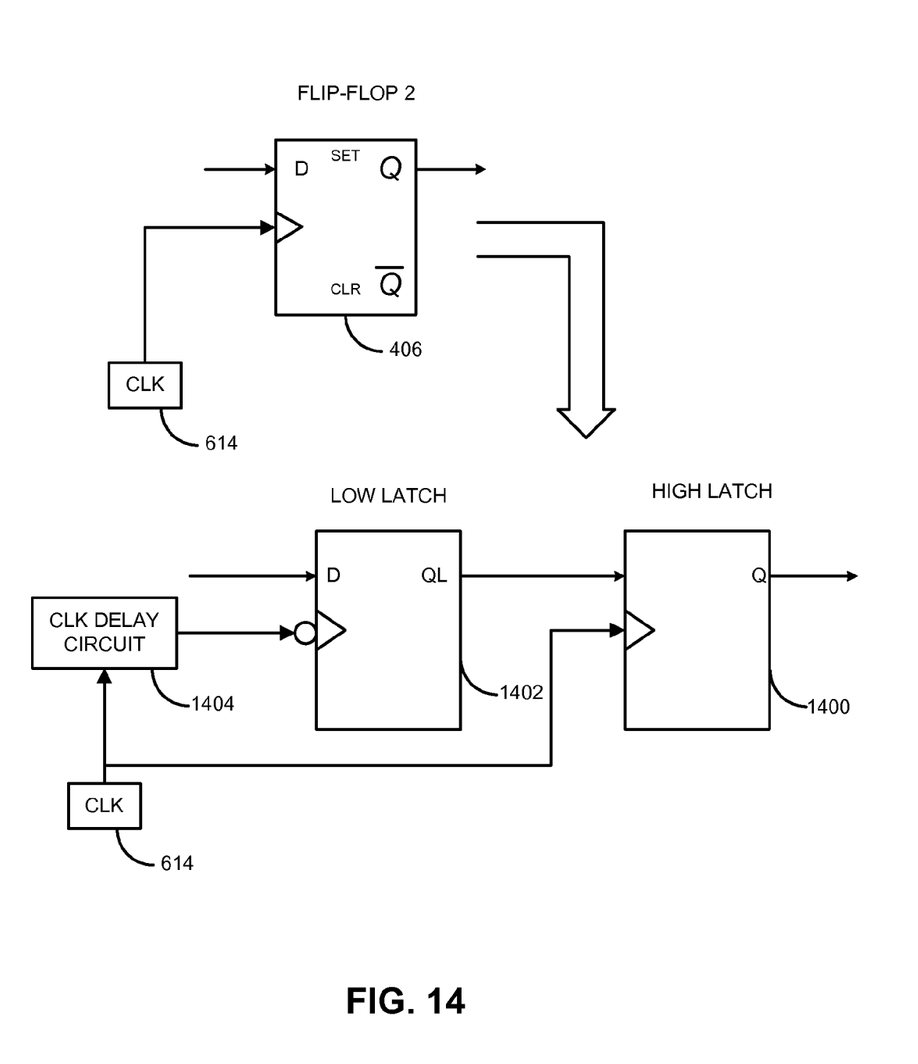
FIG. 14 is an exemplary illustration of replacing a common flip-flop between two adjacent timing critical paths with a set of low latch and high latch and a clock delay circuit in a clock path to the low latch based on a determined value of pessimism.

FIG. 13 illustrates another example a method for reducing a value of pessimism in a static timing analysis of at least two adjacent timing critical paths shown at block 302 of FIG. 3 in accordance with another embodiment set forth in the disclosure. This embodiment introduces a circuit level modification that implicitly improves timing characteristics to the maximum value (e.g., $uncty\_abs$), and may be applied when the method illustrated in FIG. 10 does not result in a significant improvement or when the extended library 224 cannot be characterized. At block 1300, a common flip-flop between the at least two adjacent timing critical paths may be replaced with a set of low latch and high latch and a clock delay circuit in a clock path to the low latch in the static timing analysis. The delay value of the clock delay circuit is greater than or equal to the determined value of pessimism. In a preferred example, the delay value of the clock delay circuit is equal to the determined value of pessimism. As discussed above, this may be performed by the equivalent circuit based optimizer 226 of the timing optimizer 212. Block 1300 is illustrated in FIG. 14. In FIG. 14, FF2 406, the common flip-flop between the two adjacent timing critical paths $a2b$ and $b2c$ in the static timing analysis, is replaced with a high latch 1400, a low latch 1402, and a clock delay circuit 1404 in the clock path from the clock input point 614 to the low latch 1402. In this example, assuming FF2 406 is a positive edge triggered flip-flip, then the low latch 1402 is followed by the high latch 1400 and with the clock signal inverted to the clock pin of the low latch 1402. The delay value of the clock delay circuit 1404 should be greater than or equal to the determined value of pessimism ($uncty\_abs$). In a preferred example, the delay value of the clock delay circuit 1404 is equal to the determined value of pessimism. Also, the delay added to the clock path should cause the net polarity to the clock pin of the low latch 1402 become positive. In one example, the clock delay circuit 1404 may be implemented by adding even number of inverters in the clock path. Accordingly, after block 1300, rerunning the static timing analysis may result in improving timing characteristics/slack for the whole design, and the value of slack improvement in this embodiment may be equal to the determined value of pessimism ($uncty\_abs$).

Also, the pessimism estimator and the timing optimizer described herein may be implemented as software programs stored on a computer readable storage medium such as but not limited to CDROM, RAM, other forms of ROM, hard drives, distributed memory, etc., in combination with processors (e.g., CPU, APU, GPGPU, etc.). As such, software programs may be stored on computer readable storage medium. The computer readable storage medium stores instructions executable by one or more processors that causes the one or more processors to perform operations described herein.

Among other advantages, for example, the method and apparatus provides the ability to absorb the process variation margins introduced in the integrated circuit design by estimating the pessimism and giving the benefit to the timing critical paths without significant power cost. The method and apparatus takes into account the timing correlation between adjacent timing critical paths in adjacent clock cycles, thereby improving the accuracy of the estimated pessimism. Moreover, without introducing statistical distributions, the method and apparatus can be easily coupled to the standard design flow and provide information for timing optimization. Accordingly, the proposed techniques can improve the quality of integrated circuit design and ease timing closure, especially in the case of tight timing constraints, by providing a way to invariably extract pessimism from the timing optimizations. Other advantages will be recognized by those of ordinary skill in the art.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. A method, carried out by one or more devices, for designing an integrated circuit to operate at a desired clock frequency range comprising:

determining a value of pessimism in a static timing analysis of at least two adjacent timing critical paths of the integrated circuit based on timing correlation between the at least two adjacent timing critical paths, wherein determining the value of pessimism comprises:

performing a first static timing analysis at a critical corner with variation information to provide a variation incorporated clock delay for each of the at least two adjacent timing critical paths;

performing a second static timing analysis at the critical corner without the variation information to provide a non-variation incorporated clock delay for each of the at least two adjacent timing critical paths;

determining a value of clock pessimism based on the variation incorporated clock delay and the non-variation incorporated clock delay for each of the at least two adjacent timing critical paths comprising:

in the first static timing analysis, determining a first variation incorporated clock delay for a first timing critical path of the at least two adjacent timing critical paths from a common flip-flop between the at least two adjacent timing critical paths to a clock divergence point of the first timing critical path;

in the first static timing analysis, determining a second variation incorporated clock delay for a second timing critical path of the at least two adjacent timing critical paths from the common flip-flop to a clock divergence point of the second timing critical path;

in the second static timing analysis, determining the non-variation incorporated clock delay from the common flip-flop to a common clock divergence point of the first and second timing critical paths; and determining the value of clock pessimism based on a difference between the non-variation incorporated clock delay and a larger one of the first and second variation incorporated clock delays; and reducing the value of pessimism in the static timing analysis of the at least two adjacent timing critical paths in response to the determination.

2. The method of claim 1, wherein the pessimism comprises at least one of removable on-chip-variation (OCV) margin from clock paths, removable OCV margin from data paths, removable IR drop margin from clock paths, and removable interconnects margin.

3. The method of claim 1, wherein determining the value of pessimism further comprises:
performing a first static timing analysis at a critical corner with variation information to provide a variation incorporated data delay for each of the at least two adjacent timing critical paths; and
performing a second static timing analysis at the critical corner without the variation information to provide a non-variation incorporated data delay for each of the at least two adjacent timing critical paths.

4. The method of claim 3 wherein determining the value of pessimism further comprises:
determining a value of data pessimism based on the variation incorporated data delay and the non-variation incorporated data delay for each of the at least two adjacent timing critical paths.

5. The method of claim 4, wherein determining the value of data pessimism comprises:
determining a first incremental data delay for a first timing critical path of the at least two adjacent timing critical paths based on a difference between a first variation incorporated data delay for the first timing critical path and a first non-variation incorporated data delay for the first timing critical path;
determining a second incremental data delay for a second timing critical path of the at least two adjacent timing critical paths based on a difference between a second variation incorporated data delay for the second timing critical path and a second non-variation incorporated data delay for the second timing critical path;
determining a Gaussian summation of the first and second incremental data delays;
determining a linear summation of the first and second incremental data delays; and
determining the value of data pessimism based on a difference between the Gaussian summation and the linear summation of the first and second incremental data delays.

6. The method of claim 1, wherein determining the value of pessimism further comprises determining the variation information based on systematic variation information and random variation information, wherein the systematic variation information comprises at least one of IR drop and hysteresis, and the random variation information comprises at least one of device variation and interconnect variation.

7. The method of claim 1, wherein reducing the value of pessimism comprises:
generating an extended library for a plurality of flip-flops in an existing library by characterizing a slope of Clock-to-Q for varying a value of Data-to-Clock delay for each of the plurality of flip-flops;
for each of the plurality of flip-flops in the extended library, determining a maximum Data-to-Clock delay decrement that guarantees an equal increment of Clock-to-Q;
determining a flip-flop with the maximum Data-to-Clock delay decrement that is greater than or equal to the determined value of pessimism from the plurality of flip-flops; and applying the determined flip-flop as a common flip-flop between the at least two adjacent timing critical paths in the static timing analysis.

8. The method of claim 1, wherein reducing the value of pessimism comprises:
replacing a common flip-flop between the at least two adjacent timing critical paths with a set of low latch and high latch and a clock delay circuit in a clock path to the low latch in the static timing analysis, wherein a delay value of the clock delay circuit is greater than or equal to the determined value of pessimism.

9. The method of claim 1 further comprising outputting executable instructions for creating the integrated circuit to operate at the desired clock frequency range based on a result of the static timing analysis taking into account the determined value of pessimism.

10. An apparatus for designing an integrated circuit to operate at a desired clock frequency range comprising:
a pessimism estimator, implemented by at least one processor, operative to determine a value of pessimism in a static timing analysis of at least two adjacent timing critical paths based on timing correlation between the at least two adjacent timing critical paths, wherein the pessimism estimator comprises:
a static timing analyzer operative to perform:
a first static timing analysis at a critical corner with variation information to provide a variation incorporated clock delay for each of the at least two adjacent timing critical paths; and
a second static timing analysis at the critical corner without the variation information to provide a non-variation incorporated clock delay for each of the at least two adjacent timing critical paths;
a clock pessimism estimator operatively coupled to the static timing analyzer, operative to determine:
a value of clock pessimism based on the variation incorporated clock delay and the non-variation incorporated clock delay for each of the at least two adjacent timing critical paths where:
in the first static timing analysis, a first variation incorporated clock delay is determined for a first timing critical path of the at least two adjacent timing critical paths from a common flip-flop between the at least two adjacent timing critical paths to a clock divergence point of the first timing critical path;
in the first static timing analysis, determining a second variation incorporated clock delay for a second timing critical path of the at least two adjacent timing critical paths from the common flip-flop to a clock divergence point of the second timing critical path;
in the second static timing analysis, determining the non-variation incorporated clock delay from the common flip-flop to a common clock divergence point of the first and second timing critical paths; and
determining the value of clock pessimism based on a difference between the non-variation incorporated clock delay and a larger one of the first and second variation incorporated clock delays; and
a timing optimizer, implemented by the at least one processor and operatively coupled to the pessimism estimator, operative to reduce the value of pessimism in the static timing analysis of the at least two adjacent timing critical paths in response to the value of pessimism determination.

11. The apparatus of claim 10, wherein the pessimism estimator further comprises a static timing analyzer operative to:

perform a first static timing analysis at a critical corner with variation information to provide a variation incorporated data delay for each of the at least two adjacent timing critical paths; and perform a second static timing analysis at the critical corner without the variation information to provide a non-variation incorporated data delay for each of the at least two adjacent timing critical paths.

12. The apparatus of claim 11, wherein the pessimism estimator further comprises:

a data pessimism estimator operatively coupled to the static timing analyzer, operative to determine a value of data pessimism based on the variation incorporated data delay and the non-variation incorporated data delay for each of the at least two adjacent timing critical paths.

13. The apparatus of claim 12, wherein determining the value of data pessimism comprises:

determining a first incremental data delay for a first timing critical path of the at least two adjacent timing critical paths based on a difference between a first variation incorporated data delay for the first timing critical path and a first non-variation incorporated data delay for the first timing critical path;

determining a second incremental data delay for a second timing critical path of the at least two adjacent timing critical paths based on a difference between a second variation incorporated data delay for the second timing critical path and a second non-variation incorporated data delay for the second timing critical path;

determining a Gaussian summation of the first and second incremental data delays;

determining a linear summation of the first and second incremental data delays; and determining the value of data pessimism based on a difference between the Gaussian summation and the linear summation of the first and second incremental data delays.

14. The apparatus of claim 10, wherein the pessimism estimator further comprises a variation estimator operatively coupled to the static timing analyzer, operative to determine the variation information based on systematic variation information and random variation information, wherein the systematic variation information comprises at least one of IR drop and hysteresis, and the random variation information comprises at least one of device variation and interconnect variation.

15. The apparatus of claim 10, wherein the timing optimizer comprises:

an extended library for a plurality of flip-flops in an existing library, wherein the extended library is generated by characterizing a slope of Clock-to-Q for varying a value of Data-to-Clock delay for each of the plurality of flip-flops; and an extended library based optimizer operatively coupled to the extended library, operative to:

for each of the plurality of flip-flops in the extended library, determine a maximum Data-to-Clock delay decrement that guarantees an equal increment of Clock-to-Q;

determine a flip-flop with the maximum Data-to-Clock delay decrement that is greater than or equal to the determined value of pessimism from the plurality of flip-flops; and apply the determined flip-flop as a common flip-flop between the at least two adjacent timing critical paths in the static timing analysis.

16. The apparatus of claim 10, wherein the timing optimizer comprises an equivalent circuit based optimizer operative to replace a common flip-flop between the at least two adjacent timing critical paths with a set of low latch and high latch and a clock delay circuit in a clock path to the low latch in the static timing analysis, wherein a delay value of the clock delay circuit is greater than or equal to the determined value of pessimism.

17. The apparatus of claim 10, wherein the pessimism comprises at least one of removable on-chip-variation (OCV) margin from clock paths, removable OCV margin from data paths, removable IR drop margin from clock paths, and removable interconnects margin.

18. The apparatus of claim 10 further operative to output executable instructions for creating the integrated circuit to operate at the desired clock frequency range based on a result of the static timing analysis taking into account the determined value of pessimism.

19. A method, carried out by one or more devices, for designing an integrated circuit to operate at a desired clock frequency range comprising:

determining a value of pessimism in a static timing analysis of at least two adjacent timing critical paths of the integrated circuit based on timing correlation between the at least two adjacent timing critical paths; and reducing the value of pessimism in the static timing analysis of the at least two adjacent timing critical paths in response to the determination, wherein reducing the value of pessimism comprises replacing a common flip-flop between the at least two adjacent timing critical paths with a set of low latch and high latch and a clock delay circuit in a clock path to the low latch in the static timing analysis, wherein a delay value of the clock delay circuit is greater than or equal to the determined value of pessimism.

20. An apparatus for designing an integrated circuit to operate at a desired clock frequency range comprising:

a pessimism estimator, implemented by at least one processor, operative to determine a value of pessimism in a static timing analysis of at least two adjacent timing critical paths based on timing correlation between the at least two adjacent timing critical paths; and a timing optimizer, implemented by the at least one processor and operatively coupled to the pessimism estimator, operative to reduce the value of pessimism in the static timing analysis of the at least two adjacent timing critical paths in response to the determination, wherein the timing optimizer comprises an equivalent circuit based optimizer operative to replace a common flip-flop between the at least two adjacent timing critical paths with a set of low latch and high latch and a clock delay circuit in a clock path to the low latch in the static timing analysis, wherein a delay value of the clock delay circuit is greater than or equal to the determined value of pessimism.

* * * * *